(12) United States Patent
Van Bommel et al.

(10) Patent No.: US 11,047,537 B2
(45) Date of Patent: Jun. 29, 2021

(54) FIXING OF LED STRIPS

(71) Applicant: SIGNIFY HOLDING B.V., Eindhoven (NL)

(72) Inventors: Ties Van Bommel, Horst (NL); Rifat Ata Mustafa Hikmet, Eindhoven (NL)

(73) Assignee: SIGNIFY HOLDING B.V., Eindhoven (NL)

(*) Notice: Subject to any disclaimer, the term of this patent is extended or adjusted under 35 U.S.C. 154(b) by 0 days.

(21) Appl. No.: 16/610,120

(22) PCT Filed: Apr. 25, 2018

(86) PCT No.: PCT/EP2018/060557
§ 371 (c)(1),
(2) Date: Nov. 1, 2019

(87) PCT Pub. No.: WO2018/202492
PCT Pub. Date: Nov. 8, 2018

(65) Prior Publication Data
US 2020/0088363 A1   Mar. 19, 2020

(30) Foreign Application Priority Data
May 2, 2017   (EP) .................................... 17168912

(51) Int. Cl.
*F21S 4/24* (2016.01)
*F21V 3/06* (2018.01)
(Continued)

(52) U.S. Cl.
CPC ................ *F21S 4/24* (2016.01); *C09J 7/383* (2018.01); *C09J 109/00* (2013.01); *F21V 3/062* (2018.02);
(Continued)

(58) Field of Classification Search
CPC .................................. F21S 4/24; H01L 33/52
See application file for complete search history.

(56) References Cited

U.S. PATENT DOCUMENTS 5,848,837 A    12/1998   Stantech
2012/0181571 A1   7/2012   Park
(Continued)

FOREIGN PATENT DOCUMENTS

CN   102618033 B   9/2013
JP   2009042260 A   2/2009
(Continued)

OTHER PUBLICATIONS

"High quality nonwaterproof led strip lights commercial", http://hkzhongquan.en.alibala.com/product/60558951190-212852201/High_quality_nonwaterproof_led_strip_lights_commercial.html.

*Primary Examiner* — Farun Lu
(74) *Attorney, Agent, or Firm* — Daniel J. Piotrowski (57) ABSTRACT

The present disclosure provides a light-emitting diode, LED, module (100) which may include a plurality of LEDs (110) assembled on a flexible substrate (120). The LED module (110) may include a cover (130) which at least partially covers the plurality of LEDs (110) and include a first constituent having elastic properties. The cover (130) may include a transformable second constituent inserted within the first constituent and adapted to, after transformation, form an interpenetrating polymer network to fix the shape of the LED module. The present disclosure also provides a method for fixing the shape of a LED module, a method of fabricating a lighting device including a LED module, and a lighting device including a LED module.

14 Claims, 4 Drawing Sheets

(51) Int. Cl.
  *H01L 33/52* (2010.01)
  *H01L 51/52* (2006.01)
  *H01L 51/00* (2006.01)
  *H01L 23/29* (2006.01)
  *H05B 33/04* (2006.01)
  *C09J 7/38* (2018.01)
  *C09J 109/00* (2006.01)
  *F21Y 103/10* (2016.01)
  *F21Y 115/10* (2016.01)

(52) U.S. Cl.
  CPC ............ *H01L 23/296* (2013.01); *H01L 33/52* (2013.01); *H01L 51/0097* (2013.01); *H01L 51/5237* (2013.01); *H01L 51/5253* (2013.01); *H05B 33/04* (2013.01); *F21Y 2103/10* (2016.08); *F21Y 2115/10* (2016.08)

(56) References Cited

U.S. PATENT DOCUMENTS

2015/0307750 A1* 10/2015 Nishijima ............ H01L 23/296
                                                                428/41.8
2017/0254518 A1*  9/2017 Vasylyev .............. F21V 17/007

FOREIGN PATENT DOCUMENTS

| JP | 2011108424 A | 6/2011 |
| JP | 2011108434 A | 6/2011 |
| JP | 2014517444 A | 7/2014 |
| JP | 2015504572 A | 2/2015 |
| WO | 2008100719 A1 | 8/2008 |
| WO | 2009019816 A1 | 2/2009 |
| WO | 2012133587 A1 | 10/2012 |
| WO | 2011135780 A1 | 7/2013 |

* cited by examiner

FIXING OF LED STRIPS

CROSS-REFERENCE TO PRIOR APPLICATIONS

This application is the U.S. National Phase application under 35 U.S.C. § 371 of International Application No. PCT/EP2018/060557, filed on Apr. 25, 2018, which claims the benefit of European Patent Application No. 17168912.8, filed on May 2, 2017. These applications are hereby incorporated by reference herein.

TECHNICAL FIELD

The present disclosure relates to the field of flexible LED modules such as LED strips. More specifically, the present disclosure relates to fixing the shape of such flexible LED strips.

BACKGROUND

Increasingly more flexible LED strips are used in various lighting applications both in home and in retail applications. Flexible LED strips may be installed at or around objects such as for example pillars, coves, walls or furniture to create different lighting effects and more aesthetic lighting designs. Such flexible LED strips may include LEDs assembled onto a flexible circuit board which is encased in an elastomer such as silicone.

When installing a flexible LED strip, the shape of the strip may have to be adjusted in order for the LED strip to fit to the object at which it is to be installed. The shape of the LED strip may for example be adjusted by bending at different angles and/or by twisting. After the shape has been adjusted, a permanent fixing of the shape may be desirable. For this purpose, bendable metal pieces may be used to bend around the LED strip. However, such devices for fixing the shape of LED strip may be less visually appealing and difficult to apply. Therefore, there is a need for an improved LED strip and way of fixing the shape of flexible LED strips.

SUMMARY OF THE INVENTION

The present disclosure seeks to at least partially fulfill the above requirements. To achieve this, devices and methods as defined in the independent claims are provided. Further embodiments of the present disclosure are provided in the dependent claims.

According to a first aspect of the present disclosure, a light-emitting diode (LED) module is provided. The module may include a plurality of LEDs that may be assembled (arranged) on flexible substrate. The LED module may include a cover that at least partly covers the plurality of LEDs. The cover may include a first constituent having elastic properties. The cover may include a transformable second constituent that may be inserted within the first constituent and adapted to, after transformation, form an interpenetrating polymer network (IPN) to fix the shape of the LED module (and the cover).

A LED module as defined herein may for example be formed as a strip. In a LED strip, the flexible substrate and the cover may be long and narrow, and the plurality of LEDs may be arranged along the length of the substrate and separated from each other by a distance. The substrate and the cover may be bent and/or twisted as required, and the cover may cover the plurality of LEDs in order to protect them from e.g. moisture, scraping, scratching or other damages. The cover may also cover and protect the substrate. As defined herein, a flexible substrate may be a substrate having elastic properties. A flexible substrate may for example be a circuit board having elastic properties, i.e. a flexible circuit board.

Herein, it is also envisaged that the LED module may have other forms. The LED module may for example be shaped as a sheet, and the plurality of LEDs may for example be arranged in a regular pattern (e.g. in an array) on the substrate.

The shape of the LED module may be adjusted by e.g. bending and/or twisting of the LED module, and the adjusted shape may then be fixed by using the transformable second constituent inserted in the first constituent to form an IPN within the cover. The IPN may for example be formed by interpenetrating a polymer network found in an elastomeric material used in the cover with the polymer network obtained by transformation of the second constituent, such as formed from e.g. polymerization of a polymerizable monomer, or evaporation of a solvent containing a dissolved polymer. Such an IPN may change the elastic properties and the flexible behavior of the cover, making it more rigid and thereby fixing the shape of the LED module. After the formation of such an IPN within the cover, the elastic (e.g. rubber-like) properties of the cover may be reduced or removed.

According to a second aspect of the present disclosure, a method for fixing the shape of a LED module is provided. The LED module may include a plurality of LEDs assembled on a flexible substrate (such as e.g. a circuit board having elastic properties) and a cover that at least partly covers the plurality of LEDs. The cover may include a first constituent having elastic properties. The LED module may for example be a LED strip as described earlier herein. The method may include inserting (e.g. diffusing, or using other suitable methods of insertion) a transformable second constituent into the first constituent. The method may further include fixing a shape of the LED module by transforming the second constituent to form an IPN within the cover.

It will be appreciated that a substrate having elastic properties may be referred to in the following as a "flexible" substrate.

In some embodiments, the first constituent may be an elastomeric material.

In some embodiments, the second constituent may be a polymerizable monomer. A polymerizable monomer is here meant a monomer which may be polymerized within the first constituent of the cover and the polymer network of which may form part of the IPN.

In some embodiments, the second constituent may be selected from the (polymerizable) group consisting of acrylates, methacrylates, vinyls, vinyl ethers, epoxides, and thiolene systems. It is also envisaged that the polymerizable monomer may be selected from other suitable monomers that may be compatible with and polymerizable in the cover.

In some embodiments, the cover may further include a polymerization initiator. If the cover includes the polymerizable monomer, the initiator may be used to start a polymerization reaction in which the monomer polymerizes and forms part of the IPN within the cover. The polymerization initiator may for example be a photo-polymerization initiator activated by light, such as for example ultra-violet (UV) light. When activated, the initiator may for example release free radicals, cations or anions which may start the polymerization process. It is also envisaged that the initiator may be activated by e.g. heat. By including the initiator in the cover, the shape of the LED module may be fixed by a user by activating the initiator.

In some embodiments of devices and methods as described herein, the second constituent may be a solvent having a polymer dissolved therein. It is envisaged that the second constituent may be transformed by evaporating (or at least partly evaporating) the solvent. By evaporating the solvent, the polymer dissolved therein may form a polymer network (which may be cross-linked), and this network may for example be entangled with the polymer network of the first constituent to form the IPN.

In some embodiments, the polymer (which is dissolved in the solvent) may be a non-elastomeric, i.e. a non-rubber-like polymer such as e.g. poly(methyl methacrylate) (PMMA).

In some embodiments, the solvent may be selected from the group consisting of acetophenones, ethyl acetates, pentyl acetates, dimhetylformamides, benzene toluenes, o-xylenes, m-xylenes, trichloromethanes, trichloroethylenes, 1,4-dioxanes and cylcohexanones. It is also envisaged that the solvent may be selected from other suitable solvents in which a suitable polymer may be dissolved.

In some embodiments, the cover may include a material selected from the group consisting of cross-linked silicones, epoxies, cross-linked polyurethanes and PVC, thermoplastic elastomer polyurethanes, PET based elastomers, and olefinic elastomers. For example, the cover may include a cured polydimethylsiloxane (PDMS) type of rubber, which may be swollen with e.g. acrylate monomer(s) to form an acrylate IPN in the PDMS rubber.

As described earlier herein, forming of the IPN may change the elastic properties of the cover (e.g. making it less flexible and more rigid) which in turn may fix the shape of the LED module.

In embodiments of devices and methods as described herein, the second constituent may be inserted in the first constituent of the cover for example by a diffusion process. The second constituent may for example be applied to the surface of the cover by spray coating, by painting, by dip coating or by similar suitable processes, and diffusion may then be used to bring the second constituent to within the first constituent and the cover. The cover may be swelled by the second constituent. It is also envisaged that the second constituent may be inserted in the first constituent and the cover by other means, such as for example by injection using e.g. a needle or similar.

In some embodiments of devices and methods as described herein, forming of the IPN may include transforming the second constituent by polymerizing the polymerizable monomer. This may, as described earlier herein, be done using a polymerization initiator such as a photopolymerization initiator or other suitable initiators.

In some embodiments, the cover may further include a transformable third constituent that is inserted into the first constituent. The third constituent may be different from the second constituent. Fixing the shape of the LED module may include transforming the third constituent to form the IPN within the cover. By using a third constituent, it is envisaged that the IPN may be formed from more than two entangled polymer networks, and that the flexibility of the cover may be further adjusted (e.g. further reduced).

Herein, it is also envisaged that the third constituent may be used with the second constituent to form the IPN without using the polymer network already found in the cover (i.e. in the first constituent). The third constituent may be inserted into the first constituent by using e.g. the same means as for inserting the second constituent into the first constituent.

Features and advantages referred to herein as belonging to the second constituent may apply also to the third constituent.

In some embodiments, a concentration of the second constituent may form a gradient within the first constituent of the cover. For example, the concentration of the second constituent (e.g. the solvent and/or the monomer) may be larger towards or at a surface of the cover than towards or at a center of the cover, or vice versa. A gradient in the concentration of the second constituent may help to further tailor the flexibility of the cover and the LED module. As an example, diffusing the second constituent only a shorter distance into the cover may be enough in some situations. By doing so, a diffusion time may be reduced. Varying the concentration within the cover may also help to tailor the changes in flexibility to the specific shape, e.g. to the cross-sectional profile, of the cover.

In some embodiments, the second constituent may be arranged within only a part or in multiple parts of the cover (and within the first constituent). As an example, the LED module may be shaped as a LED strip, the cover may be divided into sections, and only every second section may be made less flexible and more rigid by using the second constituent. In other examples, most of the cover may be made less flexible and more rigid, while some parts of the cover may be left unchanged. An advantage of such an arrangement may for example be that the LED module may be folded and/or twisted at the parts left unchanged during e.g. a removal of the LED module from the object to which it is installed.

According to a third aspect of the present disclosure, a method of manufacturing a lighting device is provided. The method may include attaching a LED module, which may include a plurality of LEDs arranged on a substrate having elastic properties (i.e. a flexible substrate) and a cover that at least partly covers the plurality of LEDs (e.g. a LED module as described herein), to a carrier of the lighting device. The method may further include fixing the shape of the LED module using a method as described herein.

Herein, a "lighting device" may for example include a luminaire, a light fixture, a lamp or similar, and the LED module may be used as a light source of the lighting device. A "carrier" may be for example a fixture within the lighting device that is arranged to hold the light source. The carrier may for example be a clamp, a profile, a socket or similar.

According to a fourth aspect of the present disclosure, a lighting device is provided. The lighting device may include a LED module as described herein.

The present disclosure relates to all possible combinations of features recited in the claims. Further, any embodiment described with reference to a method according to the second aspect or the third aspect of the present disclosure may be combinable with any one of the embodiments described with reference to the LED module according to the first aspect or the lighting device according to the fourth aspect, or vice versa.

Further objects and advantages of the various embodiments of the present disclosure will be described below by means of exemplifying embodiments.

BRIEF DESCRIPTION OF THE DRAWINGS

Exemplifying embodiments will be described below with reference to the accompanying drawings, in which.

In the drawings, like reference numerals will be used for like elements unless stated otherwise. Unless explicitly stated to the contrary, the drawings show only such elements that are necessary to illustrate the example embodiments, while other elements, in the interest of clarity, may be omitted or merely suggested. As illustrated in the figures, the sizes of elements and regions may be exaggerated for illustrative purposes and, thus, are provided to illustrate the general structures of the embodiments.

DETAILED DESCRIPTION

Exemplifying embodiments will now be described more fully hereinafter with reference to the accompanying drawings. The drawings show currently preferred embodiments, but the invention may, however, be embodied in many different forms and should not be construed as limited to the embodiments set forth herein; rather, these embodiments are provided for thoroughness and completeness, and fully convey the scope of the present disclosure to the skilled person.

Figure 1A:
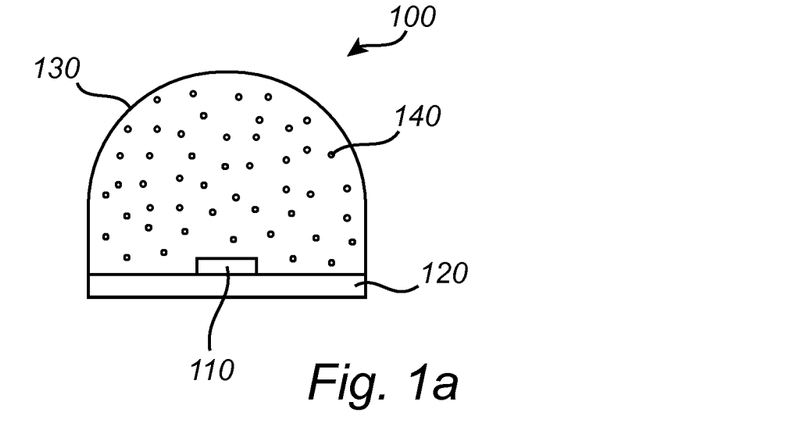
FIGS. 1a and 1b illustrate LED modules according to embodiments of the present disclosure.
Figure 1B:
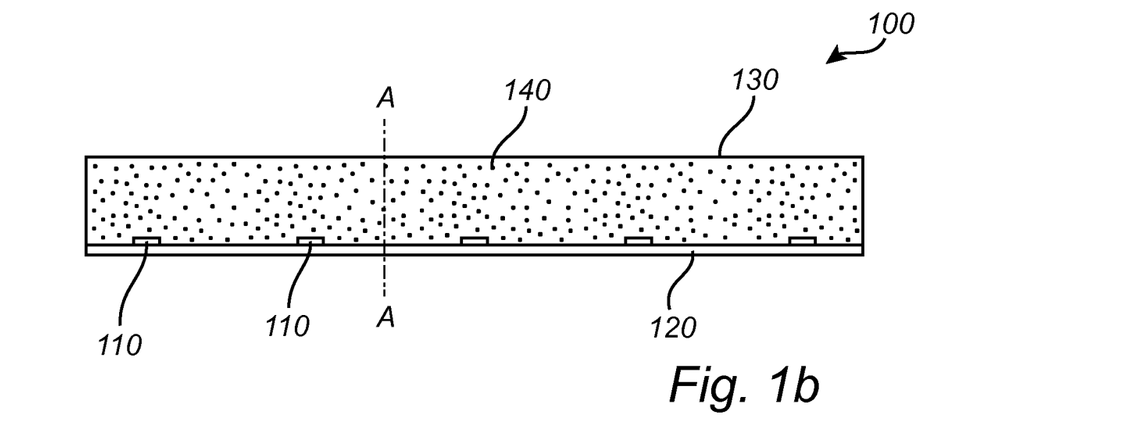

With reference to FIGS. 1a and 1b, a LED module according to some embodiments are described in the following.

FIG. 1a illustrates a cross-section of a LED module 100. The LED module 100 may include a plurality of LEDs 110 that may be arranged on a flexible substrate 120. A cover 130 having elastic properties may be arranged such that it at least partially covers the plurality of LEDs 110. In FIG. 1a, the cover 130 is arranged on the flexible substrate 120. The cover 130 (and other covers described herein) may have a first constituent, which may for example be of a rubber-like material (i.e. a solid with elastic properties), and may be flexible such that the LED module 100 may be bent and/or twisted into a desired shape. Herein, a "flexible" material is a material which has elastic properties and which may be bent and/or twisted with non-excessive force, such as force applied by one or more hands of a user installing a LED module at an object, without breaking or tearing. A flexible material may return to its initial shape after the force which was applied to change its shape is removed or at least reduced. An elastomeric material is assumed to be flexible in the sense described herein.

The cover 130 may include at least one of a solvent having a polymer dissolved therein and a polymerizable monomer. In FIG. 1a, and in other figures herein, this is illustrated by dots such as the dots 140. In the embodiments described herein, the solvent having a polymer dissolved therein and the polymerizable monomer are assumed to be examples of the transformable second constituent. By "transformable", it is meant that the second constituent may be transformed for example by polymerizing the polymerizable monomer or by evaporating the solvent to create the IPN.

FIG. 1b illustrates a side-view of the LED module 100. The LED module 100 is formed as a strip, and extends along a length transversal to its cross-section. The cross-section shown in FIG. 1a may be taken along for example the line A-A. The LEDs 110 are arranged along the length of the LED module 100, and are separated from each other by a distance.

The solvent and/or the monomer (as illustrated by the dots 140) in the cover 130 may be used to fix the shape of the LED module 100.

Figure 2:
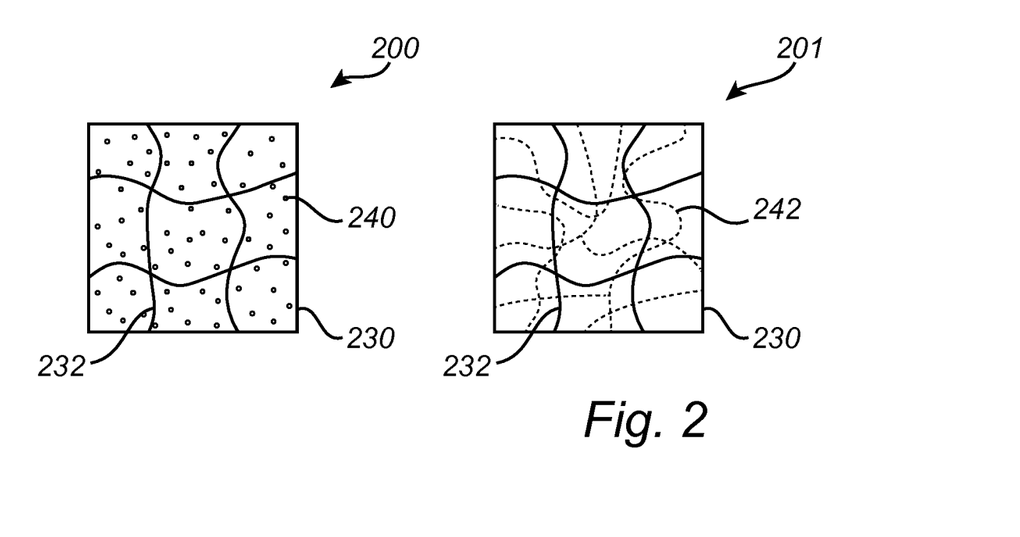
FIG. 2 illustrates slabs of elastomeric materials according to embodiments of the present disclosure.

FIG. 2 illustrates a slab 200 of an elastomeric material 230 which may be used to form e.g. the cover 130 in FIGS. 1a and 1b. Phrased differently, the slab 200 of elastomeric material 230 may part of the first constituent of the cover. The elastomeric material 230 may be formed by cross-linked polymers which form a polymer network 232. The polymers in the polymer network 232 may be stretched, but as long as the cross-links are not destroyed the material may return to its original form after a force giving rise to the stretching is removed. This may give the elastomeric material 230 its rubber-like properties. By using for example a diffusion process, a solvent in which another polymer has been dissolved, or a polymerizable monomer, may be added to the elastomeric material 230 as illustrated by the dots 240.

FIG. 2 also illustrates a slab 201 of the elastomeric material 230 in which a polymerization process has, using the solvent with the polymer dissolved therein and/or the polymerizable monomer, formed an additional polymer network 242. Phrased differently, the transformable second constituent has here been transformed. The polymer network 232 of the elastomeric material 230 and the additional polymer network 242 may be at least partially interlaced/entangled with, but not covalently bonded to, each other and form an interpenetrating polymer network (IPN). As a result, the two networks may not be separable from each other without breaking chemical bonds, and the formation of the IPN may change the flexible behavior (e.g. resulting in a reduced flexibility) of the slab 201 compared to the slab 200 in which no IPN has yet been formed.

If a polymerizable monomer is used, the polymerization process to form the additional polymer network 242 (that is, the transformation of the second constituent) may be started by using an initiator (such as e.g. a photo-polymerization initiator). If a solvent with a polymer diffused therein is used, the polymerization process may be started by evaporating the solvent by e.g. applying sufficient heat. After a sufficient amount of solvent has been evaporated, the dissolved polymer may form the additional network 242.

In some embodiments, the cover may include multiple (different) polymerizable monomers and/or one or more solvents with multiple (different) polymers dissolved therein. In this way, an additional polymer network (not illustrated) may be added to the polymer network 232 and the polymer network 242, and the IPN may be formed from more than two networks. The additional monomers and/or solvents may correspond to the third constituent described earlier herein.

Herein, the formation of the IPN may be sequential, meaning that the polymer network 232 is already present in the elastomeric material 230, and that the polymer network 242 (and the additional polymer network) are formed afterwards when fixing the shape of the LED module. It may also be envisaged that the polymer network 232 does not form part of the IPN, but that polymer networks from e.g. a polymerizable monomer and a second (different) polymerizable monomer are used to form the IPN. In such a case, the formation of the IPN may be simultaneous or sequential.

Figure 3:
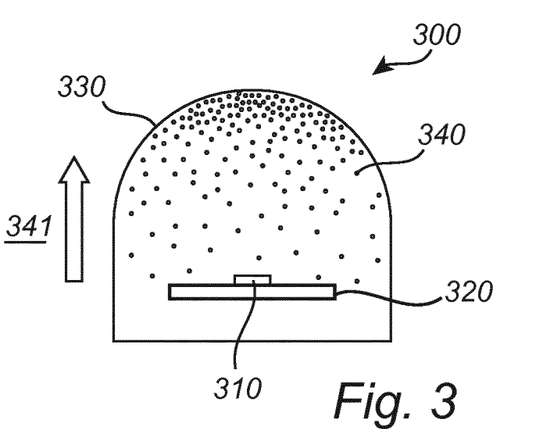
FIGS. 3 and 4 illustrate LED modules according to embodiments of the present disclosure.

FIG. 3 illustrates a cross-section of an LED strip 300 in accordance with the present disclosure. The LED strip 300 may include a plurality of LEDs 310 arranged on a flexible substrate 320, and a cover 330. In the LED strip 300, the cover 330 is arranged such that it covers also the flexible substrate 320. This may for example offer an improved protection of the flexible substrate 320 from outside elements. In the cover 330, a solvent having a polymer dissolved therein and/or a polymerizable monomer (as illustrated by the dots 340) is provided. The concentration of the solvent and/or the monomer 340 in the cover 330 forms a gradient, such that the concentration increases in the direction of the arrow 341.

Figure 4:
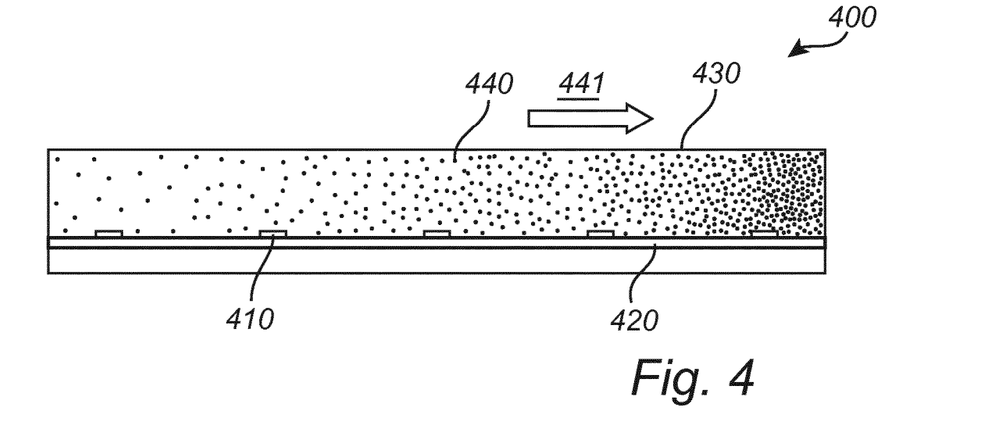

FIG. 4 illustrates a side-view of a LED module 400, which may include a plurality of LEDs 410 arranged on a flexible substrate 420, and a cover 430. Here, the concentration of solvent and/or monomer 440 forms a gradient wherein the concentration increases in the direction of the arrow 441.

Figure 5:
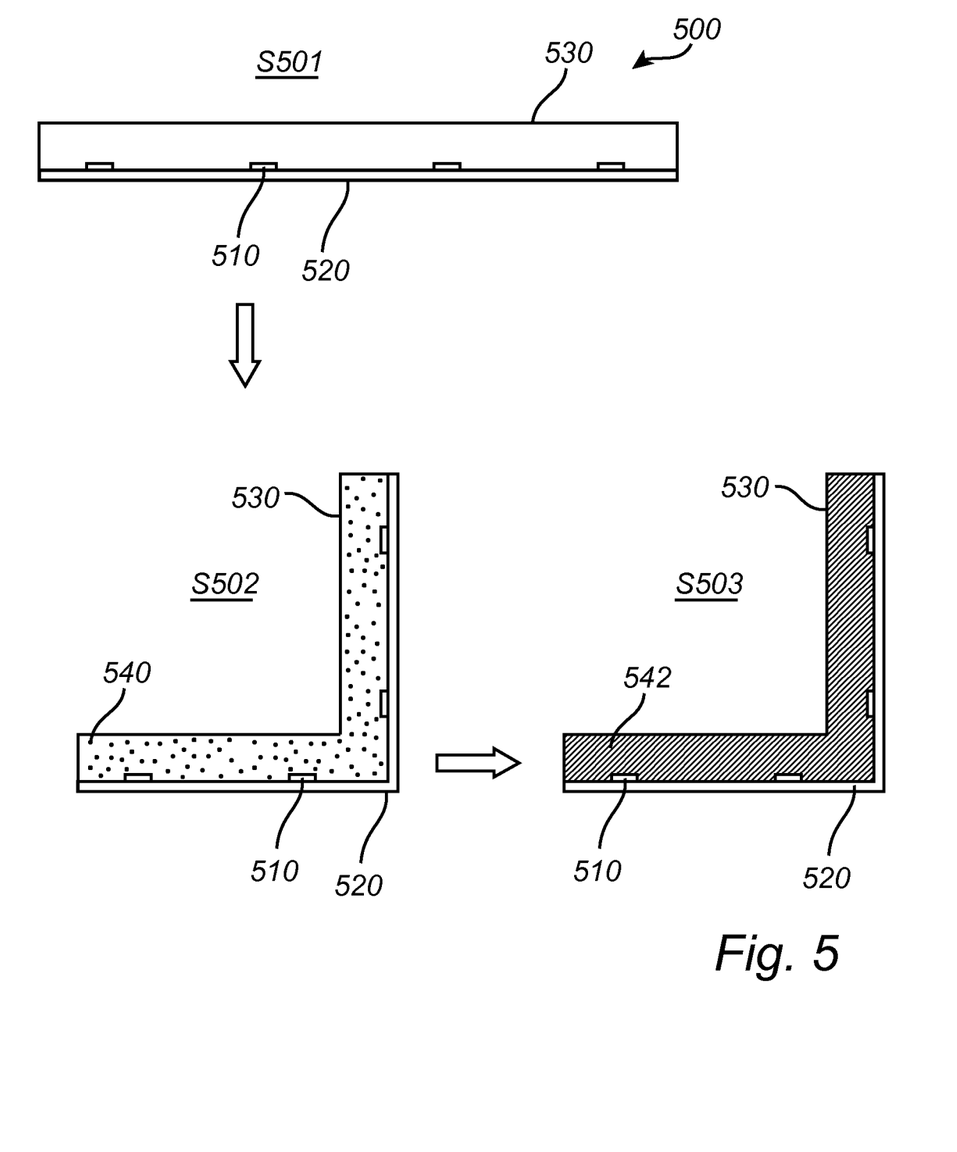
FIG. 5 illustrates a method according to embodiments of the present disclosure.

With reference to FIG. 5, a method of fixing a LED is described in the following.

FIG. 5 illustrates a method of fixing a LED module 500. The LED module 500 may include a plurality of LEDs 510 arranged on a flexible substrate 520, and a cover 530 which at least partially covers the plurality of LEDs 510. The LED module 500 is provided in a step S501.

In a further step S502 of the method, at least one of a solvent having a polymer dissolved therein and a polymerizable monomer (as illustrated by the dots 540) corresponding to the transformable second constituent may be diffused into the cover 530, which is formed from a first constituent having elastic properties. The shape of the LED module 500 may be changed, e.g. by bending the LED module 500 as illustrated in FIG. 5. The order of changing the shape of the LED module 500 and the diffusion into the cover 530 may be to first perform the diffusion and then to perform the changing of the shape, or to first perform the changing of the shape and then perform the diffusion, or to perform the changing of the shape and the diffusion simultaneously.

After having performed the diffusion and the changing of the shape, a further step S503 may include fixing the shape of the LED module 500 by using the second constituent, such as at least one of the solvent having a polymer dissolved therein and the polymerizable monomer to form an interpenetrating polymer network 544 within the cover 530.

Figure 6:
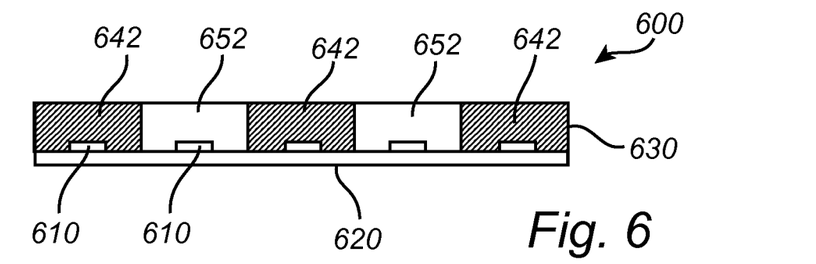
FIGS. 6, 7 and 8 illustrate LED modules according to embodiments of the present disclosure.
Figure 7:
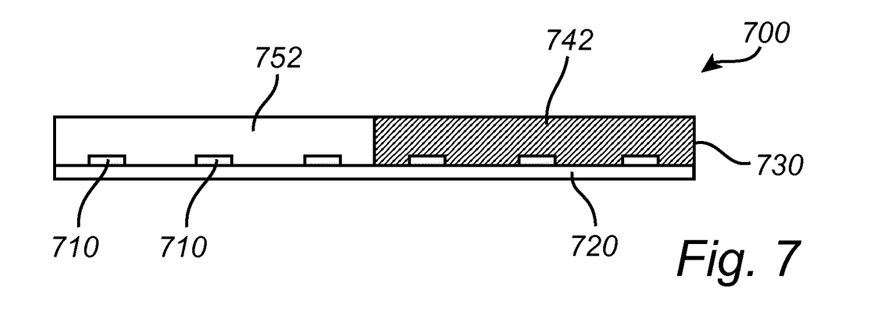
Figure 8:
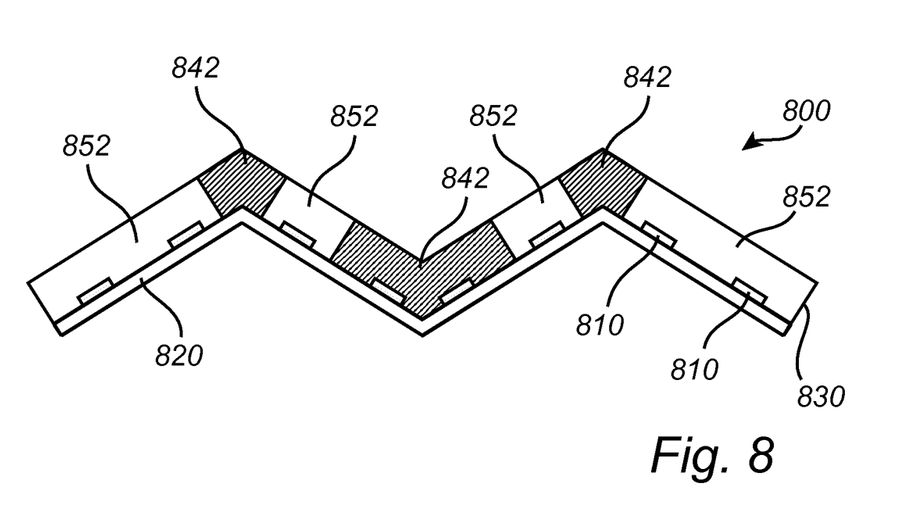

FIGS. 6 to 8 illustrate side-views of embodiments of LED modules in which only a part or multiple parts of the cover are fixed by forming one or more IPNs.

In FIG. 6, a LED module 600 (in the form of a strip) includes a plurality of LEDS 610 arranged on a flexible substrate 620, and a cover 630. The cover 630 is divided into sections, where some sections 642 have been fixed by formation of an IPN and where other sections 652 in between the sections 642 have not been fixed by formation of an IPN. This may be useful for example in that the LED module 600 may still be bent and/or twisted at the sections 652, while the sections 642 may provide an increased rigidity of the LED module 600 during e.g. installation. Likewise, as only parts of the cover 630 of the LED module 600 are fixed by the formation of an IPN, the LED module 600 may for example more easily be removed from the object at which it has been installed, and folded in order to pack it down in e.g. a box.

In FIG. 7, a LED module 700 includes a plurality of LEDs 710 arranged on a flexible substrate 720, and a cover 730. Here, the cover 730 is divided into two sections, where the section 742 has been fixed by formation of an IPN and where the section 752 has not been fixed by formation of an IPN.

In FIG. 8, a LED module 800 includes a plurality of LEDs 810 arranged on a flexible substrate 820, and a cover 830. Here, the cover 830 is divided into a plurality of sections 842 and 852, where only the sections 842 have been fixed by formation of an IPN. The shape of the LED module 800 has been fixed such that the cover 830 contains bends (or corners) at the sections 842 and is flexible in the sections 852.

Although not illustrated explicitly, methods of the present disclosure may for example be used to manufacture lighting devices (such as luminaires, lamps, light fixtures, and similar) which includes one or more LED modules (as described herein) as their source of light. A method of manufacturing such a lighting device may for example include a step where a LED module is attached to a carrier (such as a clamp, profile, socket, or similar) arranged to hold the LED module, and a step where the shape of the LED module is fixed using methods for fixing the shape of a LED module as described in the preceding embodiment. Likewise, the present disclosure also provides lighting devices which include one or more LED modules as described herein.

The steps of any method disclosed herein do not necessarily have to be performed in the exact order disclosed, unless explicitly stated to the contrary.

In a demonstration example of how to fix a LED module in accordance with the present disclosure, or of how to produce a fixable LED module in accordance with the present disclosure, a flexible LED strip embedded in a crosslinked transparent silicone rubber (poly-dimethyl siloxane) was used. The material is highly flexible and may be bent into a desired shape and form. The material was immersed in a solution containing hexandioldiacrylate provided with 1% wt Irgacure 651 photo initiator. The flexible strip was then bent into the desired shape and exposed to UV radiation. After polymerization of the acrylate monomer the strip maintained its bent shape. During polymerization it may be advantageous to avoid oxygen, and therefore the point of polymerization may be wrapped in a flexible polymer which may be transparent to UV such as a polyethylene film.

The person skilled in the art realizes that the present disclosure is by no means limited to the embodiments described above. On the contrary, many modifications and variations are possible within the scope of the appended claims.

Although features and elements are described above in particular combinations, each feature or element may be used alone without the other features and elements or in various combinations with or without other features and elements. A feature or element described above with reference to a method may also apply to a device, or vice versa.

Additionally, variations to the disclosed embodiments can be understood and effected by the skilled person in practicing the claimed invention, from a study of the drawings, the disclosure, and the appended claims. In the claims, the word "comprising" does not exclude other elements, and the indefinite article "a" or "an" does not exclude a plurality. The mere fact that certain features are recited in mutually different dependent claims does not indicate that a combination of these features cannot be used to advantage.

In general, by introducing a transformable second constituent (such as at least one of a solvent having a polymer dissolved therein and a polymerizable monomer) into the cover of a LED module (such as a LED strip), the present disclosure provides an improved way of fixing the shape of the LED module. The shape of the LED module may be for example bent and/or twisted into a desired shape and, by a transformation of the second constituent (such as by for example a polymerization process wherein an interpenetrating polymer network is formed within the cover), the shape of the cover and thereby the shape of the LED module may be fixed. The transformation (polymerization process) may be started by for example using an initiator to polymerize the polymerizable monomer, or by evaporation of sufficient amounts of the solvent. The present disclosure thus provides ways of fixing the shape of a LED module with reduced effort, and without the need for e.g. visually less appealing metal bars and/or other devices.

The invention claimed is:

1. A light-emitting diode, LED, module, comprising:
a plurality of LEDs assembled on a flexible substrate, and
a cover at least partly covering the plurality of LEDs,
wherein the cover comprises a first constituent having elastic properties and a transformable second constituent inserted within said first constituent and adapted to, after transformation, form an interpenetrating polymer network to fix a shape of the LED module, wherein the second constituent is selected from the group consisting of acrylates, methacrylates, vinyls, vinyl ethers, epoxides, and thiolene systems.

2. The LED module of claim 1, wherein the first constituent is an elastomeric material.

3. The LED module of claim 1, wherein the second constituent is a polymerizable monomer.

4. The LED module of claim 1, wherein the cover further comprises a polymerization initiator.

5. The LED module of claim 1, wherein the second constituent is a solvent having a polymer dissolved therein.

6. The LED module of claim 5, wherein the solvent is selected from the group consisting of acetophenones, ethyl acetates, pentyl acetates, dimhetylformamides, benzene toluenes, o-xylenes, m-xylenes, trichloromethanes, trichloroethylenes, 1,4-dioxanes and cylcohexanones.

7. The LED module of claim 5, wherein the polymer is a non-elastomeric polymer.

8. The LED module of claim 1, wherein the first constituent comprises a material selected from the group consisting of cross-linked silicones, epoxies, cross-linked polyurethanes and PVC, thermoplastic elastomer polyurethanes, PET based elastomers, and olefinic elastomers.

9. A method of manufacturing a lighting device, comprising:
attaching a LED module according to claim 1 to a carrier of the lighting device, and
fixing the shape of the LED module using a method.

10. A lighting device, comprising a LED module according to claim 1.

11. A method for fixing a shape of a light-emitting diode, LED, module, wherein the LED module includes a plurality of LEDs assembled on a flexible substrate and a cover at least partly covering the plurality of LEDs, said cover including a first constituent having elastic properties, said method comprising:
inserting a transformable second constituent into the first constituent, and
fixing a shape of the LED module by transforming the second constituent to form an interpenetrating polymer network within the cover,
wherein the second constituent is selected from the group consisting of acrylates, methacrylates, vinyls, vinyl ethers, epoxides, and thiolene systems.

12. A light-emitting diode, LED, module, comprising:
a plurality of LEDs assembled on a flexible substrate, and
a cover at least partly covering the plurality of LEDs,
wherein the cover comprises a first constituent having elastic properties and a transformable second constituent inserted within said first constituent and adapted to, after transformation, form an interpenetrating polymer network to fix a shape of the LED module, wherein a concentration of the second constituent forms a gradient within the first constituent of the cover.

13. A light-emitting diode, LED, module, comprising:
a plurality of LEDs assembled on a flexible substrate, and
a cover at least partly covering the plurality of LEDs,
wherein the cover comprises a first constituent having elastic properties and a transformable second constituent inserted within said first constituent and adapted to, after transformation, form an interpenetrating polymer network to fix a shape of the LED module, wherein the second constituent is arranged within only a part or in multiple parts of the cover.

14. A method for fixing a shape of a light-emitting diode, LED, module, wherein the LED module includes a plurality of LEDs assembled on a flexible substrate and a cover at least partly covering the plurality of LEDs, said cover including a first constituent having elastic properties, said method comprising:
inserting a transformable second constituent into the first constituent, and
fixing a shape of the LED module by transforming the second constituent to form an interpenetrating polymer network within the cover, and
inserting a transformable third constituent into the first constituent, and wherein said fixing a shape of the LED module comprises transforming the third constituent to form the interpenetrating polymer network within the cover.

* * * * *